US005800723A

United States Patent [19]
Juskey et al.

[11] Patent Number: 5,800,723
[45] Date of Patent: Sep. 1, 1998

[54] PROCESS FOR FABRICATING FLEX CIRCUITS AND PRODUCT THEREBY

[75] Inventors: Frank J. Juskey, Coral Springs; Douglas W. Hendricks, Gulfstream; Sally A. Stallings, Lake Worth, all of Fla.

[73] Assignee: Motorola, Inc., Schaumburg, Ill.

[21] Appl. No.: 763,958

[22] Filed: Dec. 10, 1996

[51] Int. Cl.$^6$ .................. B44C 1/22; C23F 1/00; H05K 1/00
[52] U.S. Cl. .................. 216/16; 216/41; 216/44; 216/54; 216/78; 216/17; 430/313; 430/318; 430/311; 174/254; 174/262; 174/261
[58] Field of Search .................. 216/13, 17, 41, 216/44, 54, 78, 16; 430/313, 318, 311; 174/254, 262, 261

*Primary Examiner*—Ponnathapura Achutamurthy
*Assistant Examiner*—P. Ponnaluri
*Attorney, Agent, or Firm*—Philip P. Macnak

[57] ABSTRACT

A process (200) for fabricating a flex circuit (708, 806, 812, 818 or 824) using a fabrication process without the use of a photomask includes the steps of generating (412) an electronic image (702 or 802) of circuit traces (704 or 804) representing at least a single-sided flex circuit, and selectively thermal transferring (506 or 606) a resin to either a conductively clad or non-conductive flexible substrate (304) under the control of the electronic image (702 or 802) to form either an etch resist or a conductor which defines the circuit traces (704 or 804). The conductively clad flexible substrate (304) is etched to form the circuit traces (704 or 804) of the flex circuit defined by the etch resist, after which the etch resist is removed.

25 Claims, 6 Drawing Sheets

PRIOR ART

PROCESS FOR FABRICATING FLEX CIRCUITS AND PRODUCT THEREBY

BACKGROUND OF THE INVENTION

1. Field of the Invention

This invention relates in general to a process for fabricating flex circuits, and more specifically to a process for fabricating flex circuits without the use of a photomask.

2. Background of the Invention

The fabrication of a flex circuit has in the past required the use of a photo definable mask called a photoresist mask which was applied to a copper clad flexible substrate using a photolithographic process prior to the imaging step to delineate the circuit traces. The photolithographic process in the fabrication of a flex circuit is time consuming, most demanding and costly, and limits the line resolution and spacing which can be repeatably achieved.

What is needed is a process for generating flex circuits which can improve the flex circuit fabrication yields. What is also needed is a process for generating flex circuits which utilizes an electronically stored image of the circuit traces. What is also needed is a process for generating flex circuits which have improved line resolution.

SUMMARY OF THE INVENTION

In accordance with a first embodiment of the present invention, a process for fabricating a flex circuit without the use of a photomask includes the steps of:

generating an electronic image of circuit traces representing at least a single-sided flex circuit;

selectively thermal transferring a thermal transfer resin to a conductively clad flexible substrate under control of the electronic image to form a etch resist defining the circuit traces;

etching the conductively clad flexible substrate to form the circuit traces defined by the etch resist; and removing the etch resist.

In accordance with a second embodiment of the present invention, a process for fabricating a flex circuit without the use of a photomask includes the steps of:

generating an electronic image of circuit traces representing at least a first conductive layer of a single-sided flex circuit;

storing the electronic image; and controlling a thermal transfer engine using the electronic image which is stored to selectively thermal transfer a conductive thermal transfer resin to a non-conductive flexible substrate to form conductive circuit traces.

In accordance with a third embodiment of the present invention, a process for fabricating a flex circuit without use of a photomask includes the steps of:

generating a first electronic image of circuit traces representing at least a first conductive layer on a first side of a double-sided flex circuit;

storing the first electronic image;

generating a second electronic image of circuit traces representing at least a second conductive layer on a second side of the double-sided flex circuit;

storing the second electronic image;

providing a thru-hole to provide an interconnection of the first conductive layer to the second conductive layer through the thru-hole;

controlling a thermal transfer engine using the first electronic image which is stored to selectively thermal transfer a conductive thermal transfer resin to a first side of a non-conductive flexible substrate to form the first conductive layer; and controlling the thermal transfer engine using the second electronic image which is stored to selectively thermal transfer a conductive thermal transfer resin to a second side of the non-conductive flexible substrate to form the second conductive layer, whereby the first conductive layer and the second conductive layer are interconnected through the thru-hole provided.

In accordance with a second aspect of the present invention a multilayer flex circuit comprises a non-conductive flexible substrate, a first conductive thermal transfer resin and a non-conductive thermal transfer resin. The first conductive thermal transfer resin and the non-conductive thermal transfer resin are selectively thermal transferred in a sequence to the non-conductive flexible substrate to form a first conductive layer including conductive circuit traces and a non-conductive layer using a thermal transfer engine which is controlled using a first electronic image of the first conductive layer and a second electronic image of the non-conductive layer. The layers in combination form the multilayer flex circuit.

DESCRIPTION OF THE PREFERRED EMBODIMENTS

Figure 1:
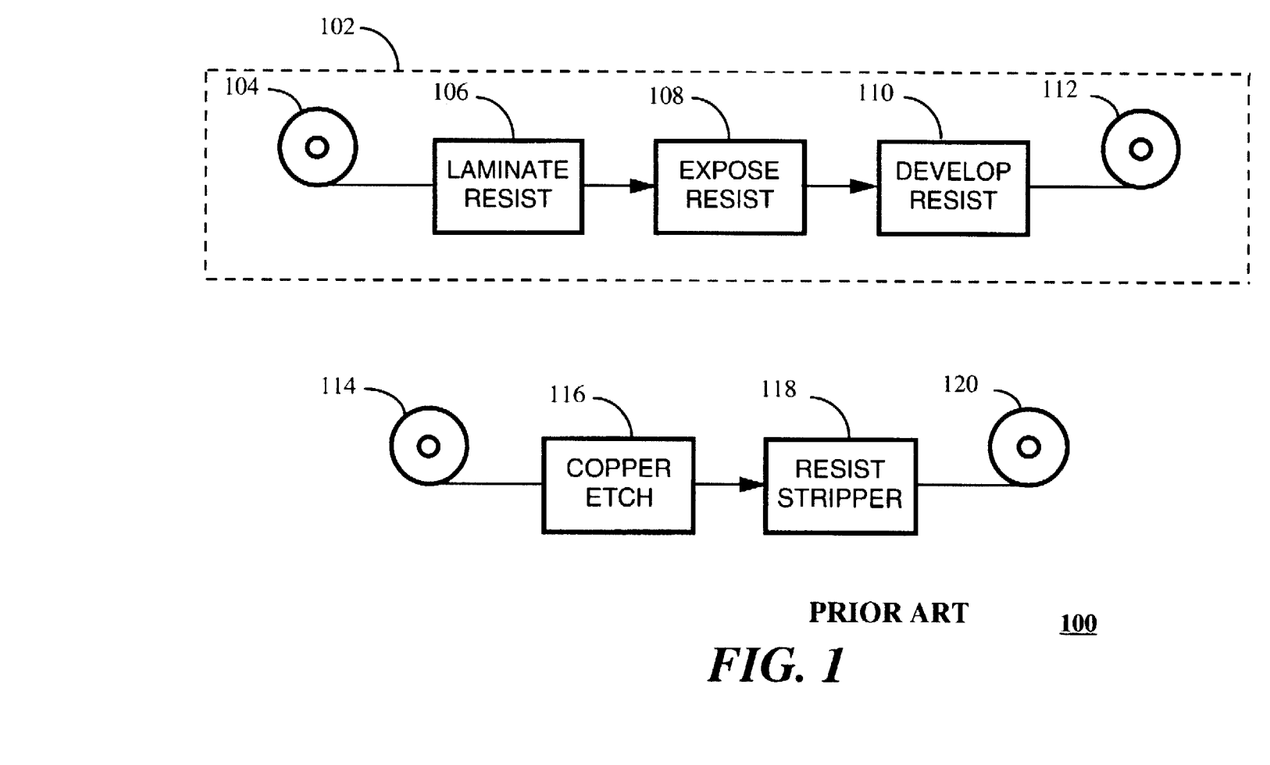
FIG. 1 is a diagram of the prior art photomask process for fabricating a flex circuit.

FIG. 1 is a diagram of the prior art photomask process 100 for fabricating a flex circuit. The prior art process requires the use of a clean room 102 which provides a Class 10K or better environment for the control of dust, pollen and other air born particulate matter. Because the prior art process utilized a photolithography process, the clean room 102 must also be outfitted with a safe light which is used during the photoresist exposure and development steps, to be described below. In the prior art process 100 a roll of a conductively clad flexible material is loaded onto a supply reel 104. The conductively clad flexible material is typically a copper clad, single-sided polyimide film suitable for many electronic circuit applications. As shown in FIG. 1, an acrylate film photoresist is continuously laminated to the conductively clad flexible material using a laminator 106 which provides heat and pressure to bond the acrylate film photoresist to the clad side of the conductively clad flexible material. A photomask artwork is positioned over the conductively clad flexible substrate at a photolithography station 108, and the photoresist is exposed to light through the photomask to photo-delineate the circuit traces onto the conductively clad flexible material. The conductively clad flexible material is next run through a developing station 110 where the photo-delineated photoresist is developed. The photoresist development process utilizes an aqueous developing solution to polymerize the photo-delineated photoresist and to remove the non-polymerized photoresist to form a etch resist which is used to protect the conductive cladding delineating the circuit traces during the etching process to follow. The conductive clad flexible material onto which the etch resist is defined was then dried and re-reeled onto an output reel 112. It will be appreciated that while the process described above discloses a continuous lamination, exposing, and development process, it will be appreciated that the same prior art process is also utilized for non-continuous processing of flex circuits.

The conductively clad flexible material onto which the etch resist was defined is then loaded onto a supply reel 114 after which the exposed copper is etched in an aqueous etching solution at an etching station 116. Following the removal of the excess copper at the etching station 116, the polymerized photoresist is removed using an aqueous resist stripper solution at a resist stripping station 118. The flex circuit material is then dried and re-reeled onto an output reel 120. The final flex circuits can then be singulated from the material and used.

Figure 2:
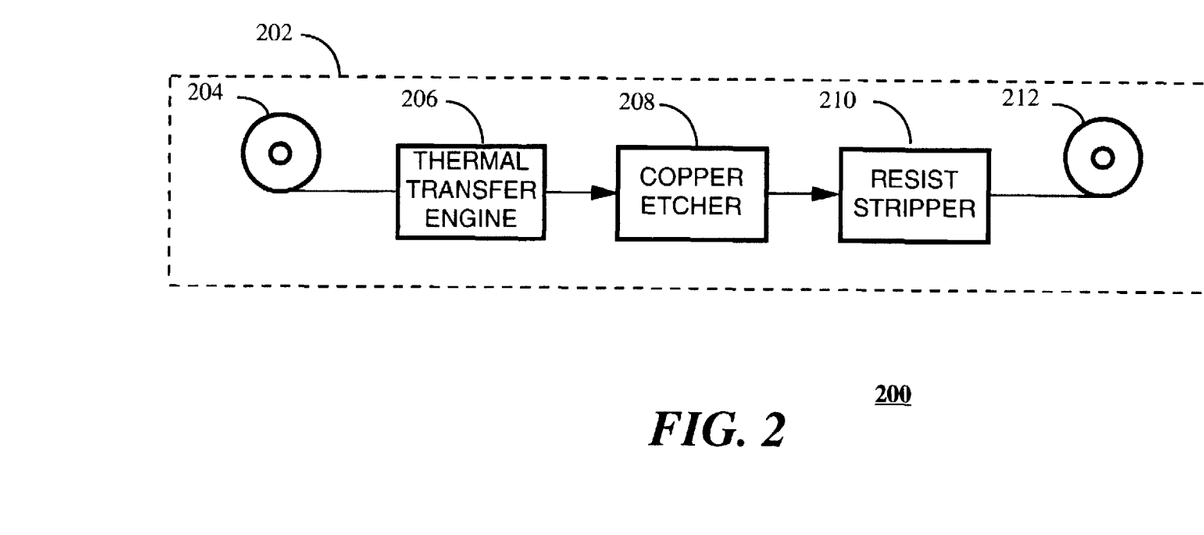
FIG. 2 is a diagram of a fabrication process for fabricating a flex circuit without the use of a photomask in accordance with a first embodiment of the present invention.

FIG. 2 is a diagram of a process 200 for fabricating a flex circuit without the use of a photomask in accordance with the present invention. A roll of a conductively clad flexible material is loaded onto a supply reel 204 and then fed into a thermal transfer engine 206 which selectively transfers a thermal transfer resin onto the conductively clad flexible substrate under the control of a processor which utilizes an electronic image to produce an etch resist which defines the circuit traces. The etch resist is generated using a thermal process to fuse the thermal transfer resin onto the conductively clad flexible substrate. The conductively clad flexible material onto which the etch resist is defined is then etched in an etching station 116. Following the removal of the excess copper at the etching station 116, the polymerized etch resist is removed at a resist stripping station 118. The flex circuit material is then dried and re-reeled onto an output reel 120. The final flex circuits can then be singulated from the material.

The fabrication process 200, described above, eliminates the photolithography step of the prior art by employing a thermal transfer resin which is deposited directly by a heat transfer process from a carrier roll, to be described below. It will be appreciated that the prior art photolithography process utilized in the fabrication of a circuit is most demanding and costly and can result in a significant loss of finished circuits due to problems in laminating, exposing and developing the photoresist. In contrast, the fabrication process 200 eliminates approximately 50% of all fabrication yield losses and approximately 80% of all cost associated with flex circuit fabrication. In addition, the elimination of the photoresist step totally eliminates all of the capital costs associated with the clean room and maintaining a clean room environment, which represents approximately 75% of all capital costs associated with flex circuit manufacture.

Figure 3:
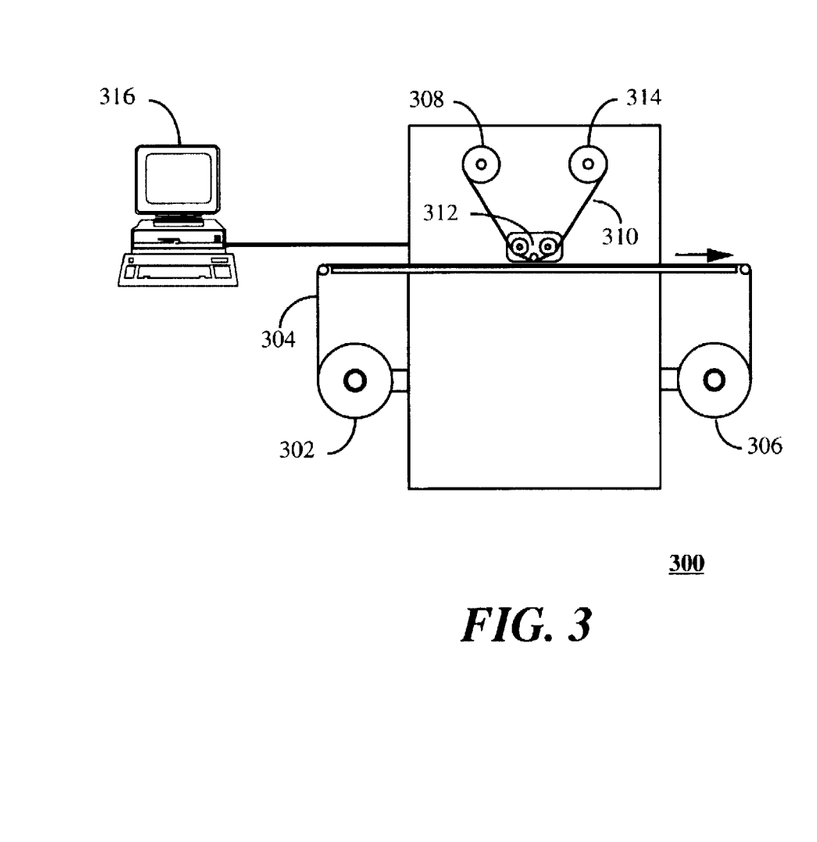
FIG. 3 is a diagram of a thermal transfer printer suitable for fabricating a flex circuit without the use of a photomask in accordance with the first embodiment of the present invention.

FIG. 3 is a diagram of a thermal transfer printer 300 suitable for fabricating a flex circuit in accordance with the present invention. The thermal transfer printer 300 utilizes a supply reel 302 to supply the conductively clad flexible material 304 and a take-up reel 306 to accumulate the conductively clad flexible material 304 in a continuous manner. By way of example, the conductively clad flexible material can be either a single or double sided copper clad polyimide film substrate suitable for manufacture of a wide variety of electronic circuits and circuit interconnects.

An example of a thermal transfer printer suitable for use as the thermal transfer engine 206 of FIG. 2, is the LP8410 series short run multicolor label printing and converting system manufactured by Markem Corporation of Keene NH. Such a thermal transfer printer is capable of accepting a 6½ inch wide roll of conductively clad flexible material which would allow up to a 6 inch wide electronically generated artwork to be utilized. The thermal transfer printer includes a supply reel 308 to supply thermal transfer resin 310 in a continuous carrier roll and an output reel 314 to accumulate any unused thermal transfer resin remaining on the carrier roll. The thermal transfer resin is thermally transferred to the conductively clad flexible material via a ceramic thermal print head 312 which can provide a resolution in excess of 299 dots per inch, and preferably a resolution of at least 400 dots per inch to obtain the line resolution required for fine pitch line spacing. A thermal transfer engine processor 316 enables storage of an electronic image, as will be described below, retrieval of the electronic image to provide layout optimization and orientation of the electronic image relative to the width of the conductively clad flexible material, and the creation of a job file suitable for controlling the thermal print head 312 operation, also as will be described further below. The thermal transfer engine processor 316 is a personal computer which is used to electronically control the operation of the thermal transfer printer.

The thermal transfer resins that are currently available for use in label making applications are phenolic resins, which while they can be used to a limited extent as a resist mask for flexible circuit fabrication, require the use of a solvent resist stripper, such as methylene chloride, to remove the thermal transfer resins from the etched cladding. Phenolic resins, suitable for flexible circuit fabrication are not available in the prior art and enable the use of aqueous resist strippers which are well known in the art, and such thermal transfer resins are preferable to the thermal transfer resins available in the prior art. It will be appreciated that acrylic modified compounds can also be utilized as the thermal transfer resin. Acrylic modified resins enable the use of aqueous resist strippers, which are in common use in the printed circuit board industry.

Figure 4:
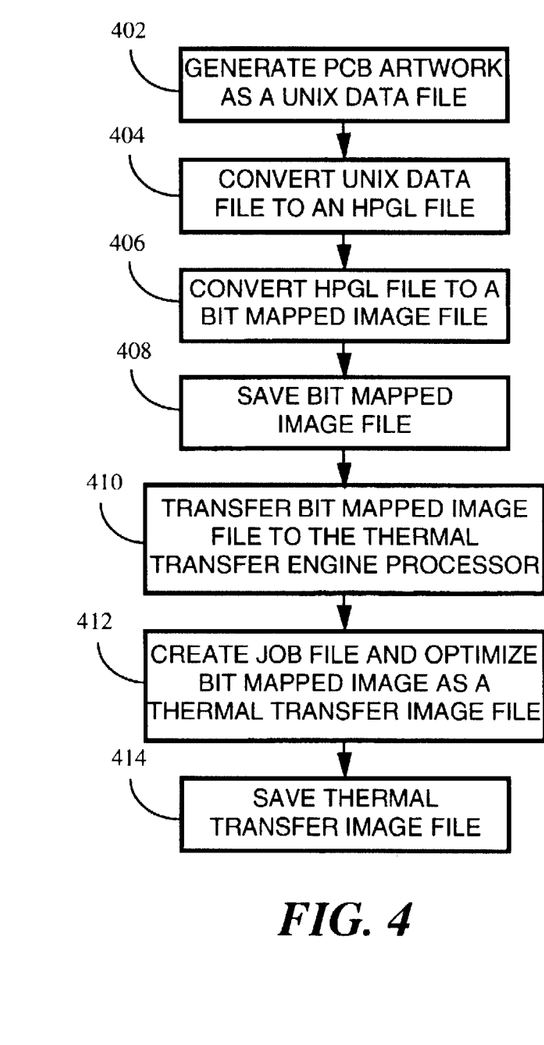
FIG. 4 is a flow chart describing the generation of an electronic image representing a flex circuit in accordance with the present invention.

FIG. 4 is a flow chart describing the generation of an electronic image representing a flex circuit in accordance with the present invention. A mechanical designer would generate a single or double sided printed circuit board (PCB) layout in a manner well known in the art, at step 402 and save the resulting PCB artwork as a data file, such as a UNIX data file. In the prior art flex circuit manufacturing process, the UNIX data file would be used by the PCB manufacturer to generate the photomask required in the photolithography process. In accordance with the present invention, the UNIX data file is converted into an intermediate data file format at step 404, such as the HPGL data file format, which is suitable to be delivered to a conventional dot matrix printer to provide a hard copy of the printed circuit board layout. The HPGL data file is then converted to a bitmapped image, at step 406, and then saved as a bitmapped image file, at step 408. It will be appreciated that the UNIX data file can be converted directly into a bitmapped image with suitable conversion software. The bitmapped image is preferably generated at a 400 dot per inch resolution which corresponds to the current upper resolution of the thermal print head 312 described above, in preferably a TIFF file format. Steps 402 through 408 are typically performed on a computer workstation, such as a Sparc 10 workstation manufactured by Sun Microsystems, Inc. of Palo Alto, Calif. The bitmapped image file can be further processed by the computer to enhance the clarity of the circuit traces using photographic image enhancement software, such as Adobe Photoshop™. Modifications of the electronic image representing the PCB artwork can also be done using the photographic image enhancement software.

The bitmapped image file is then transferred to the thermal transfer engine processor 316 using either a floppy disk or directly via a data communications network, such as an ethernet network, at step 410. The thermal transfer engine processor is used to create a job file, at step 412, to control the operation of the thermal transfer printer and to optimize the bitmapped image for running on the thermal transfer printer. Optimization includes such operations as orienting the electronic image with respect to the width of the conductively clad flexible substrate and generation of a thermal transfer image file which controls the thermal print head 312 operation. The thermal transfer image file is then saved at step 414.

Figure 5:
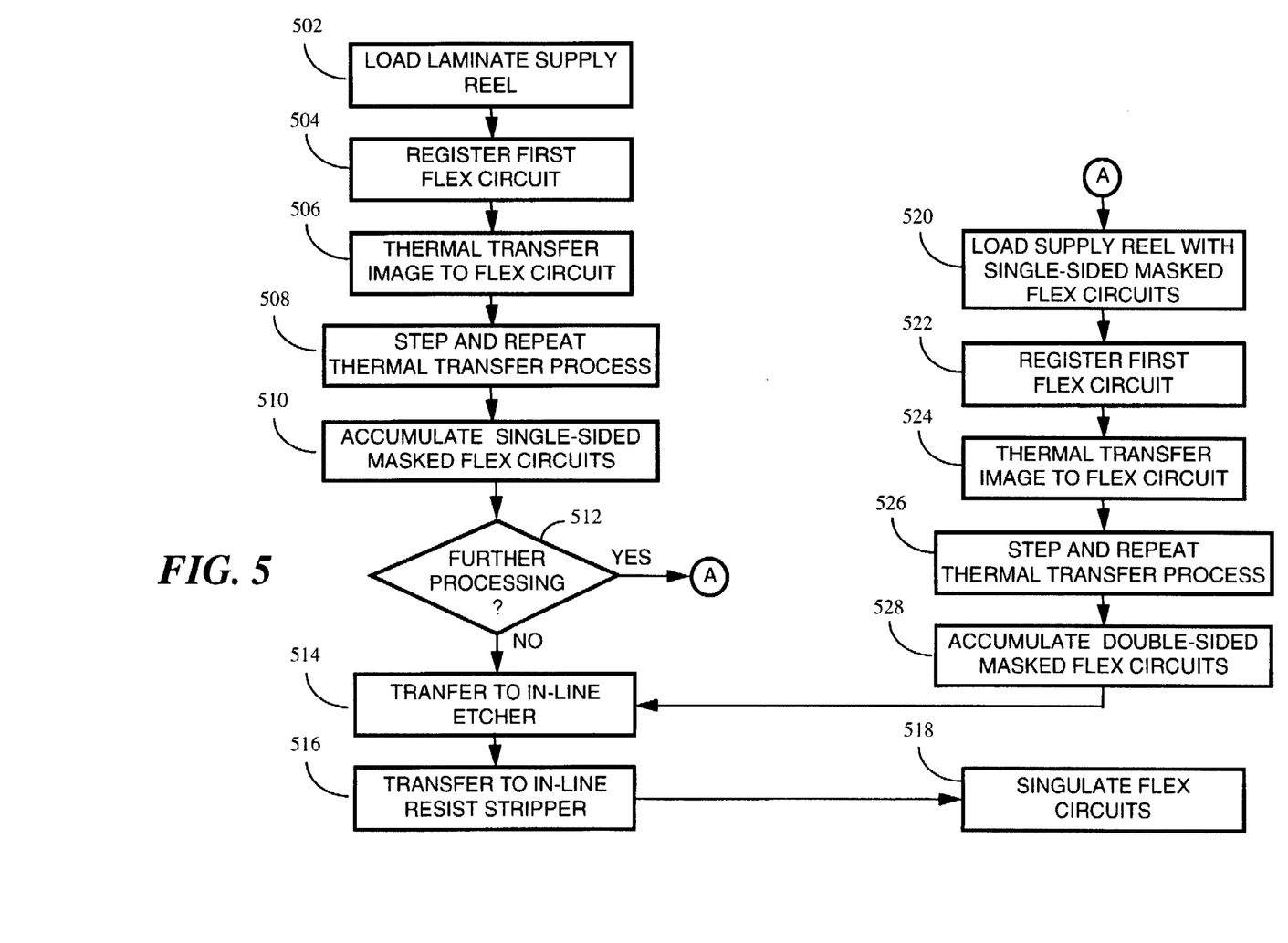
FIG. 5 is a flow chart illustrating the generation of a single or double sided flex circuit without the use of a photomask in accordance with the first embodiment of the present invention.

FIG. 5 is a flow chart illustrating the generation of a single or double sided flex circuit in accordance with the present invention. The laminate supply reel 302 is loaded with a roll of conductively clad flexible material 304, at step 502, and includes connecting of the tail of the conductively clad flexible material 304 to the take-up reel 306. The first flex circuit is then registered at step 504 and the thermal transfer printer started. The thermal transfer image file is recalled and the electronic image is selectively thermal transferred to the conductively clad flexible material at step 506. When using the thermal transfer printer, such as described above, the image is selectively thermal transferred at a rate of approximately 2 inches per second, although it will be appreciated that this rate can be greater or smaller depending upon the design of the thermal transfer printer. The thermal transfer process is repeated at step 508 thereby generating multiple flex circuits in a continuos process. As the thermal transfer printing process proceeds, the conductively clad flexible material 304 is accumulated on the take-up reel 306, at step 510. Unlike the prior art photolithographic printing process which required the photoresist to be dried before the reeling process could proceed, the conductively clad flexible material with the thermal transferred image can be reeled without any intermediate drying step.

When, at step 512, the conductively clad flexible material is determined to be double sided, the laminate supply reel 302 is re-loaded, at step 520, with a roll of conductively clad flexible material 304 which has been previously processed as described above to define the circuit traces on the first side of the conductively clad flexible material, and includes connecting of the tail of the conductively clad flexible material 304 to the take-up reel 306. The first flex circuit is then registered with the previously generated flex circuit, at step 522, and the thermal transfer printer started. The thermal transfer image file is recalled and the electronic image for the second side is selectively thermal transferred to the conductively clad flexible material at step 524. The thermal transfer process is repeated at step 526 thereby generating multiple double sided flex circuits in a continues process. As the thermal transfer printing process proceeds, the conductively clad flexible material is accumulated on the take-up reel 306, at step 528.

The conductively clad flexible material which has been processed through steps 502 through 510 for a single sided flexible circuit, or through steps 520 through 528 for a double sided flexible circuit is then transferred to an etching station, at step 514, where the excess cladding is removed in a manner well known in the art, and then transferred to a resist stripper station 210 where the thermal transferred resin is removed, at step 516, also in a manner well known in the art. The flex circuits which have been formed as described above can then be singulated from the roll of conductively clad flexible material, at step 518, in a manner well known in the art.

Figure 6:
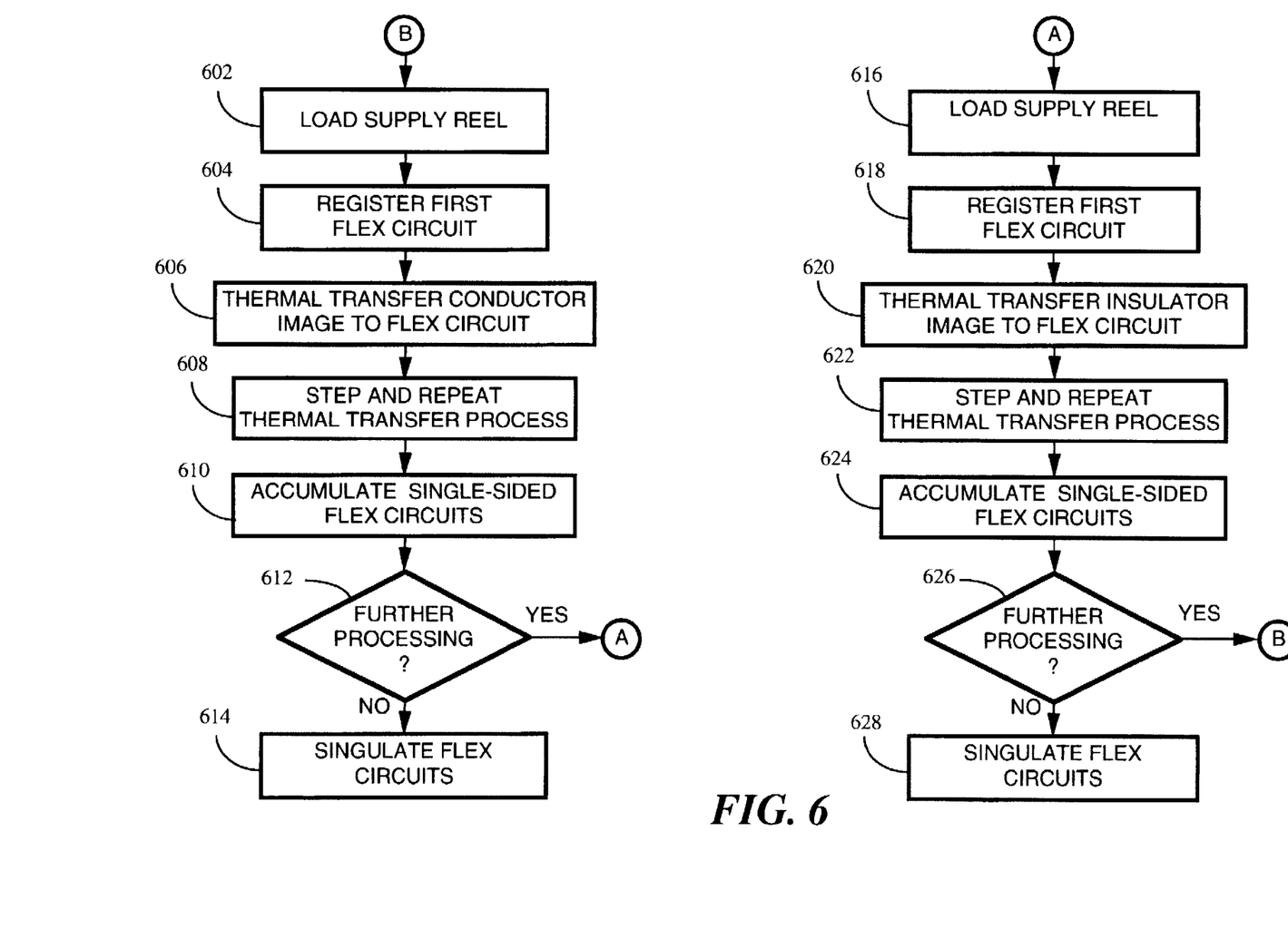
FIG. 6 is a flow chart illustrating the generation of a single sided single or multilayer flex circuit without the use of a photomask in accordance with a second embodiment of the present invention.

FIG. 6 is a flow chart illustrating the generation of a single sided, single or multilayer, flex circuit in accordance with an alternate embodiment of the present invention. The supply reel 302 is loaded with a roll of non-conductive flexible material 304, at step 602, and includes connecting of the tail of the non-conductive flexible material 304 to the take-up reel 306. The non-conductive flexible material is by way of example a thin flexible film typically selected from a group of flexible films such as mylar, polycarbonate, styrene acrylonitrile (SAN), nylon, and polyethylene (PE). It will be appreciated that other flexible films which are not deformed by the thermal transfer process can be utilized as well.

The first flex circuit is then registered at step 604 and the thermal transfer printer started. The thermal transfer image file storing at least a first electronic image defining conductive circuit traces is recalled and a conductive thermal transfer resin is selectively thermal transferred to the conductively clad flexible material at step 606 to form the conductive circuit traces. The thermal transfer process is repeated at step 608 thereby generating multiple single layer flex circuits in a continues process. As the thermal transfer printing process proceeds, the non-conductive flexible material 304 is accumulated on the take-up reel 306, at step 610. When no further processing of the single layer flex circuit is to be performed, at step 612, the flex circuits which have been formed as described above can then be singulated from the roll of non-conductive flexible material, at step 614, in a manner well known in the art.

When further processing is to take place, at step 612, the supply reel 302 is loaded with a roll of non-conductive flexible material 304 which has a conductive traces thermally transferred thereon, at step 602, and includes connecting of the tail of the non-conductive flexible material 304 to the take-up reel 306. The first flex circuit is then registered at step 618 and the thermal transfer printer started. The thermal transfer image file storing a second electronic image defining adhesive or insulating areas is recalled, and in one embodiment, a adhesive thermal transfer resin, or thermal transfer adhesive, is selectively thermal transferred between conductive circuit traces, at step 620 to form a selectively positioned bonding medium which is suitable for attaching, for example, leadless components. It will be appreciated that the thermal transfer adhesive can be conductive, in which instance circuit interconnects to external circuits or integrated circuit die can be formed. In a second embodiment, a non-conductive thermal transfer resin is selectively applied to cover at least a portion of the conductive traces, thereby selectively forming an isolation mask. The thermal transfer process is repeated at step 622 thereby generating multiple single layer flex circuits with a selectively applied adhesive or a selectively applied isolation mask in a continues process. As the thermal transfer printing process proceeds, the non-conductive flexible material 304 is accumulated on the take-up reel 306, at step 624. When no further processing of the single layer flex circuit is to be performed, at step 626, the flex circuits which have been formed as described above can then be singulated from the roll of non-conductive flexible material, at step 628, in a manner well known in the art.

When further processing is to take place, at step 626, the supply reel 302 is again loaded with a roll of non-conductive flexible material 304 which has for example conductive traces and an insulating layer or solder mask thermally transferred thereon, at step 602, and includes connecting of the tail of the non-conductive flexible material 304 to the take-up reel 306. The first flex circuit is then registered at step 604 and the thermal transfer printer started. The thermal transfer image file storing a third electronic image defining by way of example a second layer of conductive traces is recalled. Steps 606 through 612 would then be repeated, thereby forming a multilayer flex circuit. When no further processing of the multilayer flex circuit is to be performed, at step 612, the flex circuits which have been formed as described above can then be singulated from the roll of non-conductive flexible material, at step 614, in a manner well known in the art.

When further processing is to take place, at step 612, the supply reel 302 is again loaded with a roll of non-conductive flexible material 304 which is by way of example the multilayer flex circuits, at step 616, and includes connecting of the tail of the non-conductive flexible material 304 to the take-up reel 306.

The first flex circuit is then registered at step 618 and the thermal transfer printer started. The thermal transfer image file storing a fourth electronic image defining by way of example a second non-conductive layer is recalled. Steps 620 through 626 would then be repeated, thereby forming an insulated multilayer flex circuit. When no further processing of the insulated multilayer flex circuit is to be performed, at step 626, the flex circuits which have been formed as described above can then be singulated from the roll of non-conductive flexible material, at step 614, in a manner well known in the art.

While the process of FIG. 6 describes thermal transferring each conductive or non-conductive layer to a non-conductive flexible material in separate layers, it will be appreciated that the thermal transfer printer can be equipped with multiple thermal transfer engines each thermal transferring one or more conductive thermal transfer resins and one or more non-conductive thermal transfer resins for each of the individual layers in a sequence, thereby having to load the non-conductive flexible material onto the thermal transfer printer only one time to fabricate a flex circuit having conductive traces, a flex circuit having conductive traces and insulating layer, a multilayer flex circuit, or a multilayer flex circuit with an insulating layer.

Figure 7:
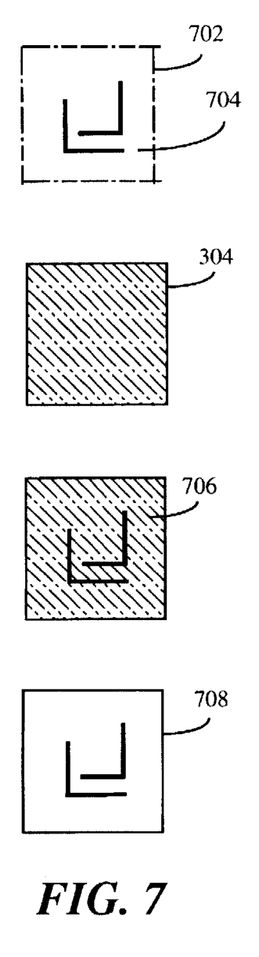
FIG. 7 is a diagram illustrating the fabrication process for fabricating a flex circuit without the use of a photomask in accordance with the first embodiment of the present invention.

FIG. 7 is a diagram illustrating the process for fabricating a flex circuit without the use of a photomask in accordance with a first embodiment of the present invention. A representation of an electronic image 702 includes circuit traces 704 representing at least a single-sided flex circuit. The electronic image 702 is used to control a thermal transfer engine 206 to selectively thermal transfer a non-conductive thermal transfer resin onto a conductively clad flexible substrate 304 to form an etch resist 706 defining the circuit traces. The conductively clad flexible substrate is etched to delineate the circuit traces defined by the etch resist, which is then stripped to complete the fabrication of a flex circuit, such as a single sided flex circuit 708. The process described by FIG. 7 is repeated, as described previously above, to fabricate a double sided flex circuit.

Conductive thermal transfer resins suitable for fabricating a flex circuit as described above are unique to the present invention. Such conductive thermal transfer resins utilize a flexible film base, such as phenolic, polycarbonate or polystyrene to which a conductive thermal transfer material is applied. Examples of conductive thermal transfer materials include carbon and graphite, silver, gold, aluminum, indium, nickel and bismuth to name a few.

The single sided flex circuit 708 described above, when utilizing a mylar substrate or other material, is by way of example suitable for use as heat seal connectors and circuit interconnects for the read/write heads on computer disk drives and for other similar applications.

Figure 8:
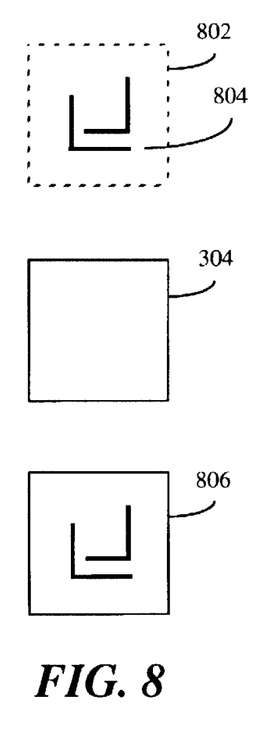
FIGS. 8–11 are diagrams illustrating the fabrication process for fabricating a flex circuit without the use of a photomask in accordance with the second aspect of the present invention.

FIGS. 8–11 are diagrams illustrating the process for fabricating a flex circuit without the use of a photomask in accordance with a second embodiment of the present invention. Referring to FIG. 8, a representation of the electronic image 802 includes circuit traces 804 representing at least a single-sided flex circuit. The electronic image 802 is used to control a thermal transfer engine 206 to selectively thermal transfer a conductive thermal transfer resin onto a non-conductive flexible substrate 304 to fabricate a flex circuit 806 having conductive circuit traces 804 formed directly onto the non-conductive flexible material without any further processing. The flex circuit 806 can be utilized as is as a single sided flex circuit or processed further as will be described below.

Figure 9:
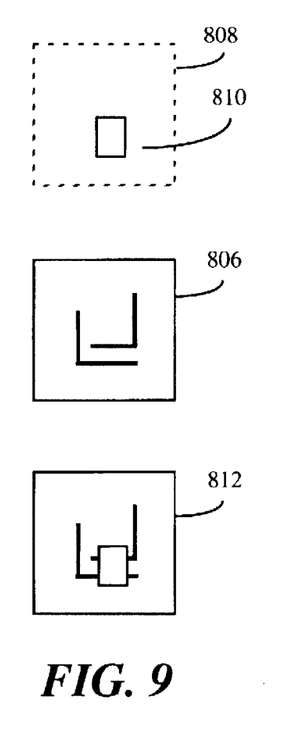

Referring to FIG. 9, a representation of a second electronic image 808 which defines an adhesive layer to be positioned between two or more conductive circuit traces, or as specifically shown in FIG. 9, a non-conductive area to be positioned over at least a portion of the circuit traces to provide as a first non-conductive layer an insulation mask 810. The electronic image 808 is used to control a thermal transfer engine 206 to selectively thermal transfer a non-conductive thermal transfer resin over the conductive circuit traces 804 to fabricate a flex circuit 812 having conductive circuit traces 804, at least a portion of the conductive circuit traces being covered by the insulation mask 810. The flex circuit 812 can be utilized as is as a single sided flex circuit, or processed further as will be described below. When the adhesive layer is positioned between two or more conductive traces, the adhesive layer provides a bonding medium by which components can be affixed to the flexible non-conductive substrate. It will be appreciated that the adhesive layer can be conductive, in which instance the adhesive layer provides a conductive bonding medium by which components can be affixed to the conductive circuit traces to provide an electrical connection.

Figure 10:
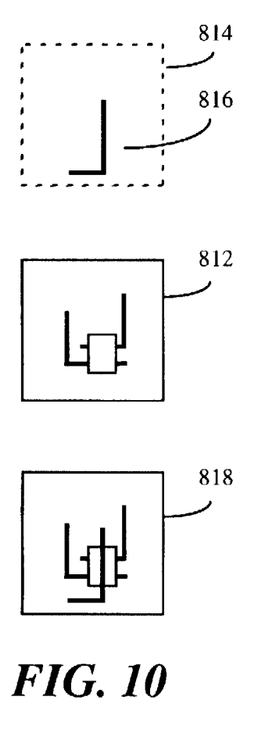

Referring to FIG. 10, a representation of a third electronic image 814 which defines a second conductive layer 816 to be overlaid over at least a portion of the non-conductive layer 810. The electronic image 814 is used to control a thermal transfer engine 206 to selectively thermal transfer a conductive thermal transfer resin over the non-conductive layer 810 to fabricate a multilayer flex circuit 818. The multilayer flex circuit 818 can be utilized as is, or processed further as will be described below.

Figure 11:
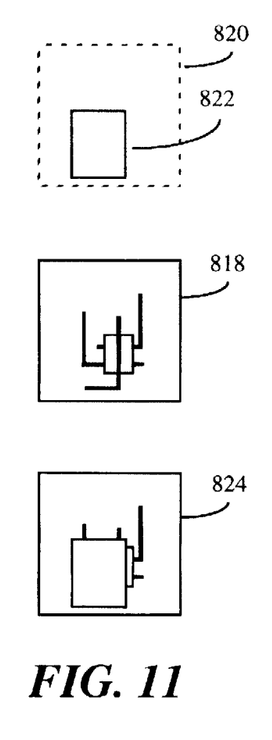

Referring to FIG. 11, a representation of a fourth electronic image 820 which defines a second non-conductive layer 822 to be overlaid over at least a portion of the second conductive layer 816 and, as shown, the non-conductive layer 810 to form as a second non-conductive layer a second older mask covering at least a portion of the multilayer flex circuit 818. The electronic image 820 is used to control a thermal transfer engine 206 to selectively thermal transfer a second non-conductive thermal transfer resin over the second conductive layer 816 to fabricate the multilayer flex circuit 824 which is covered at least in part by a second insulation resist. The multilayer flex circuit 824 can be utilized as is, or processed further as will be described below.

Figure 12:
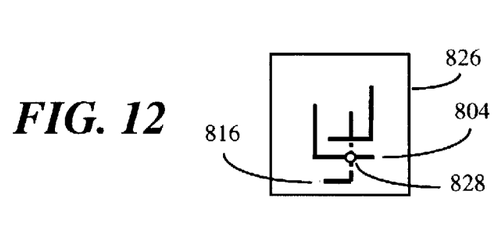
FIG. 12 is a diagram illustrating the fabrication process for fabricating a double sided flex circuit without the use of a photomask in accordance with a third embodiment of the present invention.

The process for fabricating a flex circuit as described in FIGS. 8 and 10 can be also utilized to fabricate doubled sided flex circuits as shown in FIG. 12 which is a diagram illustrating the fabrication process for fabricating a double sided flex circuit 826 without the use of a photomask in accordance with a third embodiment of the present invention. Thru-holes 828 (only one of which is shown) to connect the top and bottom sides of the double sided flex circuit can be generated either prior to or during the thermal transfer printing process. The thru-holes 828 preferably have an aspect ratio of 2:1 which is a measure of the thickness of the flexible substrate to the diameter of the thru-holes (the size of the thru-hole shown is highly exaggerated). The conductive circuit traces thermal transferred to the top side of the flexible substrate, such as circuit traces 804 of FIG. 8, can be connected to conductive circuit traces thermal transferred to the bottom side of the flexible substrate, such as circuit trace 816 of FIG. 10, whereby the electrical connection is completed through the thru-hole 828, thereby adding significant flexibility to the process for fabricating a flex circuit in accordance with the present invention.

In summary, a process for fabricating a flex circuit without use of a photomask has been described above which utilizes selective thermal transferring of a conductive or non-conductive thermal transfer resin to a non-conductive or conductively clad flexible substrate, respectively, under the control of an electronic image which has been stored. The selectively thermal transferred resin forms either an etch resist which protects the conductively clad flexible substrate during an etching operation, or a conductor. Because the process for fabricating a flex circuit utilizes an electronic image that represents at least a first side of a flexible circuit, the file representing the electronic image can be readily modified and a flex circuit fabricated from the modified electronic image can be produced with the changes in a matter of minutes rather than in days or weeks as required by the prior art photolithographic process. The thermal transfer process described above is capable of resolving a line down to 0.0025 inches which greatly surpasses the finest line requirement currently required in most flex circuit applications today, and as a result can enhance the density of circuit interconnections that can be provided on a flex circuit. Single sided and double sided flex circuits can be fabricated and well as single layer and multilayer flex circuits, as was described above.

We claim:

1. A process for fabricating a flex circuit without use of a photomask comprises:

generating an electronic image representing circuit traces for a first side of a flex circuit; and transferring a thermal transfer resin to a conductively clad flexible substrate under control of the electronic image representing circuit traces for the first side of a flex circuit to form an etch resist pattern on a first side of the conductively clad flexible substrate.

2. The process of fabricating a flex circuit according to claim 1, wherein the thermal transfer resin is a phenolic resin.

3. The process of fabricating a flex circuit according to claim 1, wherein the thermal transfer resin is an acrylic modified compound.

4. The process of fabricating a flex circuit according to claim 1, wherein the conductively clad flexible substrate utilizes a polyimide substrate.

5. The process of fabricating a flex circuit according to claim 4, wherein the polyimide substrate is copper clad.

6. The process of fabricating a flex circuit according to claim 1, wherein the conductively clad flexible substrate is clad on two sidles, and said process further comprises:

generating an electronic image representing circuit traces for a second side of the flex circuit;

transferring a thermal transfer resin to the conductively clad flexible substrate under control of the electronic image representing the circuit traces for the second side of a flex circuit to form an etch resist pattern on the second side of the conductively clad flexible substrate;

etching the conductively clad flexible substrate to form the circuit traces defined by the etch resist pattern formed on the first side of the conductively clad flexible substrate and on the second side of the conductively clad flexible substrate; and removing the thermal transfer resin forming the etch resist pattern formed on the first side of the conductively clad flex substrate and the second side of the conductively clad flex substrate.

7. The process of fabricating a flex circuit according to claim 1 further comprising:

etching the conductively clad flexible substrate to form the circuit traces for the first side of a flex circuit defined by the etch resist pattern; and removing the thermal transfer resin forming the etch resist pattern.

8. The process of fabricating a flex circuit according to claim 7, wherein said etching step utilizes a solvent resist stripper.

9. The process of fabricating a flex circuit according to claim 7, wherein said etching step utilizes an aqueous resist stripper.

10. A process for fabricating a flex circuit without use of a photomask comprises:

generating an electronic image of circuit traces representing a single-sided flex circuit utilizing a computer;

storing the electronic image;

controlling a thermal transfer engine using the electronic image which is stored to transfer a thermal transfer resin to a conductively clad flexible substrate to form an etch resist pattern on the conductively clad flexible substrate;

etching the conductively clad flexible substrate to form the circuit traces defined by the etch resist pattern; and removing the etch resist pattern.

11. The process of fabricating a flex circuit according to claim 10, wherein the electronic image of the circuit traces is a bitmapped image.

12. The process of fabricating a flex circuit according to claim 11, wherein the bitmapped image has a resolution of at least 400 dots per inch.

13. The process of fabricating a flex circuit according to claim 10, wherein the thermal transfer engine is a thermal transfer printer.

14. The process of fabricating a flex circuit according to claim 13, wherein the thermal transfer printer has a resolution greater than 299 dots per inch.

15. The process of fabricating a flex circuit according to claim 13, wherein the thermal transfer printer operates at a resolution of at least 400 dots per inch.

16. A process for fabricating a flex circuit without use of a photomask comprising:

generating an electronic image of circuit traces representing a first conductive layer of a flex circuit;

storing the electronic image; and controlling a thermal transfer engine using the electronic image which is stored to transfer a conductive thermal transfer resin to a non-conductive flexible substrate to form a first layer of conductive circuit traces.

17. The process of fabricating a flex circuit according to claim 16, wherein the electronic image is generated using a computer.

18. The process of fabricating a flex circuit according to claim 16, wherein the non-conductive flexible substrate utilizes a flexible film, the flexible film being selected from a group of flexible films consisting of mylar, polycarbonate, styrene acrylonitrile, nylon, and polyethylene.

19. The process of fabricating a flex circuit according to claim 16, further comprising:

generating a second electronic image defining an adhesive layer to be positioned between conductive circuit traces;

storing the second electronic image; and controlling the thermal transfer engine using the second electronic image which is stored to transfer an adhesive thermal transfer resin which is used to secure components to the non-conductive flexible substrate.

20. The process of fabricating a flex circuit according to claim 19, wherein the adhesive thermal transfer resin is non-conductive.

21. The process of fabricating a flex circuit according to claim 19, wherein the adhesive thermal transfer resin is conductive.

22. The process of fabricating a flex circuit according to claim 16 further comprising:

generating a second electronic image representing a first non-conductive layer to be overlaid over a portion of the conductive circuit traces;

storing the second electronic image; and controlling the thermal transfer engine using the second electronic image which is stored to transfer a non-conductive thermal transfer resin to form an isolation mask.

23. The process of fabricating a flex circuit according to claim 22 further comprises the steps of:

generating a third electronic image representing a second conductive layer to be overlaid over a portion of the first non-conductive layer;

storing the third electronic image; and controlling the thermal transfer engine using the third electronic image which is stored to transfer a second conductive thermal transfer resin to form the second conductive layer of a multilayer flex circuit.

24. The process of fabricating a flex circuit according to claim 23 further comprising:

generating a fourth electronic image representing a second non-conductive layer to be overlaid over a portion of the second conductive layer;

storing the fourth electronic image; and controlling the thermal transfer engine using the fourth electronic image which is stored to transfer a non-conductive thermal transfer resin to form a second isolation mask.

25. A process for fabricating a flex circuit without use of a photomask comprises:

generating a first electronic image representing circuit traces for a first conductive layer on a first side of a double-sided flex circuit;

storing the first electronic image;

generating a second electronic image representing circuit traces for a second conductive layer on a second side of the double-sided flex circuit;

storing the second electronic image;

providing a through hole to provide an interconnection of the first conductive layer to the second conductive layer through the through hole;

controlling a thermal transfer engine using the first electronic image which is stored to transfer a conductive thermal transfer resin to a first side of a non-conductive flexible substrate to form the first conductive layer; and controlling the thermal transfer engine using the second electronic image which is stored to transfer a conductive thermal transfer resin to a second side of the non-conductive flexible substrate to form the second conductive layer, whereby the first conductive layer and the second conductive layer are interconnected through the through hole provided.

* * * * *

UNITED STATES PATENT AND TRADEMARK OFFICE
CERTIFICATE OF CORRECTION

PATENT NO. : 5,800,723
DATED      : September 1, 1998
INVENTOR(S) : Juskey, et. al.

It is certified that error appears in the above-identified patent and that said Letters Patent is hereby corrected as shown below:

Column 10, line 8, change "sidles" to --sides--.

Signed and Sealed this

Eighth Day of February, 2000

Attest:

Q. TODD DICKINSON

Attesting Officer

Commissioner of Patents and Trademarks